United States Patent [19]

Yano et al.

[11] Patent Number: 4,740,824

[45] Date of Patent: Apr. 26, 1988

[54] SOLID-STATE IMAGE SENSOR

[75] Inventors: Kensaku Yano, Yokohama; Takao Kon, Tokyo; Masayuki Kakegawa, Chigasaki, all of Japan

[73] Assignee: Kabushiki Kaisha Toshiba, Kawasaki, Japan

[21] Appl. No.: 886,555

[22] Filed: Jul. 17, 1986

[30] Foreign Application Priority Data

Jul. 18, 1985 [JP] Japan .................. 60-156953

[51] Int. Cl.$^4$ ..................... H01L 29/44; H01L 31/08; H01L 27/14
[52] U.S. Cl. ......................... 357/30; 357/24; 357/31; 357/32; 250/578
[58] Field of Search ............... 357/30 R, 30 H, 30 K, 357/24, 24 LR, 31, 32; 250/578

[56] References Cited

U.S. PATENT DOCUMENTS 4,523,372 6/1985 Balda ..................... 357/54

FOREIGN PATENT DOCUMENTS

| 0029367 | 5/1981 | European Pat. Off. | 357/30 |
| 58-17784 | 2/1983 | Japan | 357/30 |
| 58-46773 | 3/1983 | Japan | 357/30 |
| 58-80975 | 5/1983 | Japan | 357/30 |
| 58-106965 | 6/1983 | Japan | 357/30 |

OTHER PUBLICATIONS

Chikamura, "A Half Inch in Silicon", *IEDM*, 1984, pp. 552-555, Wash., D.C., Dec. 1984.

*Primary Examiner*—Andrew J. James
*Assistant Examiner*—Jerome Jackson
*Attorney, Agent, or Firm*—Cushman, Darby & Cushman

[57] ABSTRACT

In a solid-state image sensor, a semiconductor structure having storage sections and a transfer section is formed in a substrate and an insulating film is formed on the substrate. Charge transfer electrodes are buried in the insulating film above the transfer section and pixel electrodes are formed on the insulating film and are electrically connected to the storage sections through electrodes, respectively. A photoconductive film for converting to incident light rays to electrical charges is formed on the insulating film, a barrier layer is formed on the film and a transparent electrode is formed on the barrier layer. Electrodes and semiconductor layers are buried in the insulating film such that each of the semiconductor layers is partly contacted to the photoconductive film, thereby a diode structure is formed by the photoconductive film, the semiconductor layer and the pixel electrodes.

7 Claims, 4 Drawing Sheets

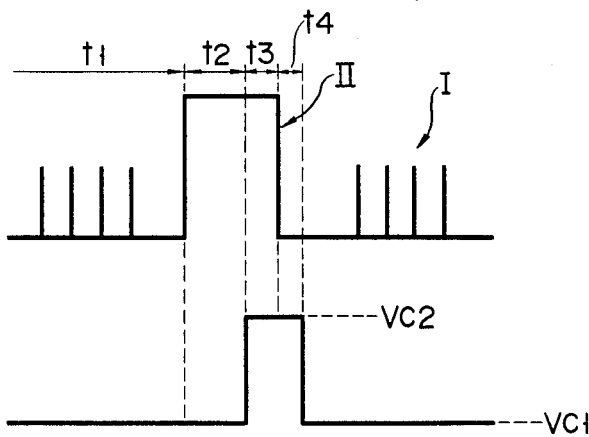
F I G. 4A
F I G. 4B
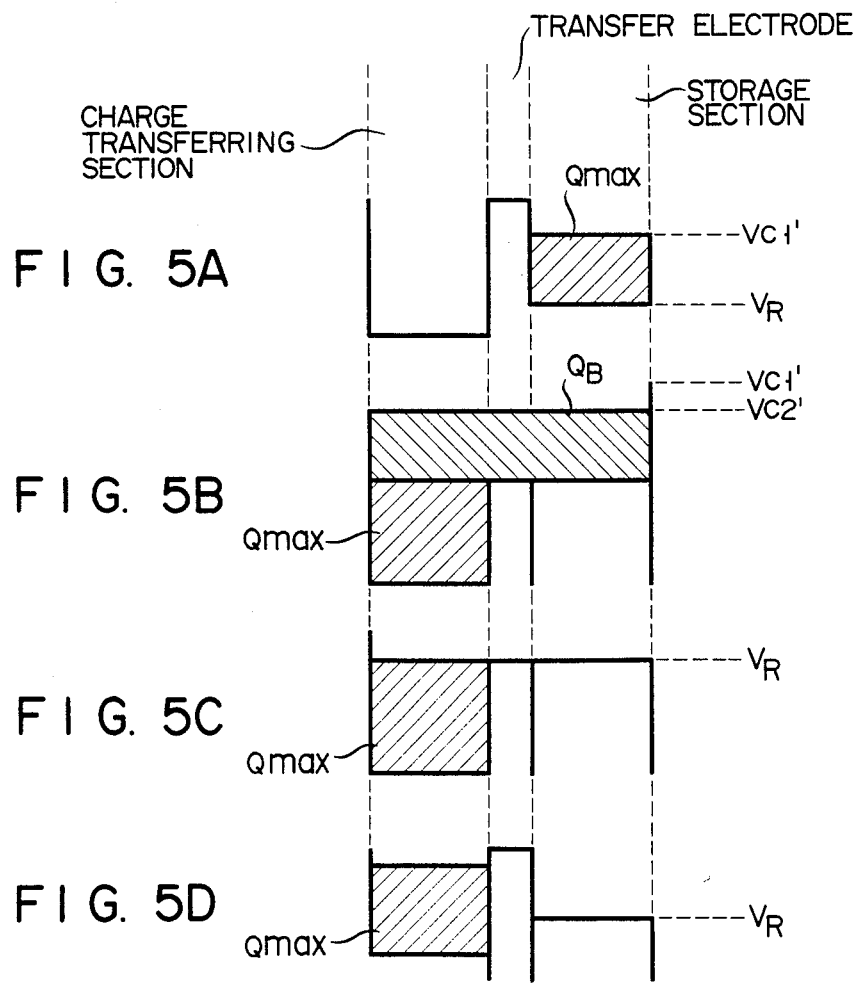
F I G. 5A
F I G. 5B
F I G. 5C
F I G. 5D

SOLID-STATE IMAGE SENSOR

BACKGROUND OF THE INVENTION

The present invention relates to a solid-state image sensor and, more particularly, to a solid-state image sensor comprising a semiconductor substrate having a charge transferring section and a photoconductive film or layer formed on the semiconductor substrate.

A conventional solid-state image sensor with a photoconductive film has good characteristics such as high sensitivity and low snear since the photoconductive layer converts light rays to electrical signals. This sensor can be used in various TV cameras, for instance as a monitor TV camera, and it is regarded as a solid-state sensor of the next generation.

A typical image sensor comprises a semiconductor substrate having a charge transferring section, a photoelectric conversion section formed on the substrate, and a transparent electrode formed on the photoelectric conversion section.

The semiconductor substrate has charge storage diode regions corresponding to pixels (or picture elements) and pixel electrodes connected to the diode regions. The photoelectric conversion section is formed on the pixel electrodes, and a transparent electrode is formed on the photoelectric conversion section. This section has a barrier layer at the side of the transparent electrode. The barrier layer prevents electrons from entering into the pixel electrodes from the transparent electrode. The section having a photoconductive layer and a barrier layer provides a low dark current and a small image lag. When the photoelectric conversion layer is a film made of an i-type hydrogenated amorphous silicon, the barrier layer is often made of a p-type hydrogenated amorphous silicon carbide. In this case, an i-p structure is provided in the photoelectric conversion section.

The conventional image sensor has a major problem, i.e., blooming. Blooming occurs when any pixel is illuminated with an excessively intense light ray, and hence an excessive electrical charge is accumulated. Such excess charges overflow the pixel and are inevitably transferred to the adjacent pixels. The adjacent pixels as well as the intensely illuminated pixel generate electrical signals. When an intense light ray is applied to the image sensor, a bright vertical line or lines will appear on the screen of a display apparatus, inevitably degrading the quality of the image.

Two factors promote the blooming. The first factor is that the pixel electrodes are spaced apart to the extent that the total area of the gaps between the pixel electrodes is 30% of the total light-receiving area of the image sensor. The light rays passing through the gaps among the pixel electrodes reach the semiconductor substrate and are converted into carriers. The carriers diffuse from the charge storage diode to the charge transferring section and mix with the other carriers stored in the device. The second factor promoting blooming is that the storage capacity of the substrate is several times the maximum vertical transfer charge of the semiconductor device. When intense light rays are applied to the image sensor, an excessively great charge is generated and overflows from the charge storage section.

A device having a blooming prevention structure is disclosed in Japanese patent disclosure No. 55-104176. Such a device has a light-shielding section for shielding light rays passing through the gaps between pixel electrodes. Apparently, however, the light-shielding section can do nothing against the blooming occurring due to the insufficient transfer capacity of the charge transferring section.

A method having a blooming prevention structure is known. This method is to apply a voltage to the transparent electrode so that an excessive charge is transferred from the semiconductor device to the electrode. When this method is used, a sufficient amount of charge cannot be transferred to the electrode since the barrier layer is provided in the photoelectric conversion section.

Still another device having a blooming prevention structure is known. In this device, electrodes are formed in the gaps between the pixel electrodes and connected to the photoelectric conversion section, and a voltage is externally applied to these electrodes to discharge the charge in the photoelectric conversion section. More specifically, Japanese patent disclosure Nos. 58-17784 and 58-80975 disclose image sensors having a charge control electrode.

In the image sensor of disclosure No. 58-17784, the charge control electrode is formed between the pixel electrodes to improve resolution. With this structure, it is impossible to sufficiently prevent light rays from reaching the semiconductor substrate through the gap among the pixel electrodes and the charge control electrode. When the packing density of pixels is such that each pixel is 1 $\mu$m long and 1 $\mu$m wide, it is difficult to form a charge control electrode between the pixel electrodes.

In the image sensor of disclosure No. 58-80975, the charge control electrode is formed in the photoelectric conversion section. However, as in the conventional image sensors, the light rays cannot be sufficiently shielded from reaching the semiconductor substrate. Hence, blooming cannot be completely prevented. Furthermore, it requires a complicated process to form the charge control electrode in the conversion section. As a result, the breakdown voltage of the conversion section is lowered, and the image sensor may be damaged.

SUMMARY OF THE INVENTION

The object of the present invention is to provide a solid-state image sensor which can adjust an amount of charge in a photoconductive film and can reduce the amount of light reaching a semiconductor substrate.

According to the invention, there is provided a solid-state image sensor comprising:

a photoconductive film for converting incident light rays to electrical charges;

a semiconductor structure having storage sections corresponding to pixels for storing charges and a transfer section for transferring the charges from the storage sections in the form of output image signals;

first electrodes each having one end connected to the corresponding storage section and insulated from the transfer section, said first electrodes being arranged at predetermined intervals and extending above a semiconductor substrate;

an insulating film formed on the first electrodes and having a flat surface;

second electrodes formed on the flat surface of the insulating film, arranged at predetermined intervals forming gaps therebetween and electrically connected to the first electrodes, said photoconductive film being formed on these second electrodes;

a barrier layer formed on the photoconductive film, forming a barrier protecting the photoconductive film;

a transparent third electrode formed on the barrier layer;

fourth electrodes formed on the insulating film, electrically connected to one another and electrically insulated from the second electrodes, each of said fourth electrodes having a peripheral region facing the adjacent second electrodes said fourth electrodes overlapping said gaps between said first electrodes; and semiconductor layer formed on the fourth electrodes for preventing one of electrons and holes from passing through the semiconductor layer from the fourth electrode to the photoconductive film, allowing the one to pass through the semiconductor layer from the photoconductive film to the fourth electrode, said semiconductor layer, said photoconductive film and said electrodes forming a diode structure.

BRIEF DESCRIPTION OF THE DRAWINGS

FIGS. 4A to 4B are timing charts illustrating when pulses are supplied to the transfer electrode and fourth electrode of the image sensor shown in FIG. 1;

FIGS. 5A to 5D show how potentials change at the charge storage section and charge transferring section of the image sensor;

DETAILED DESCRIPTION OF THE PREFERRED EMBODIMENTS

Figure 1:
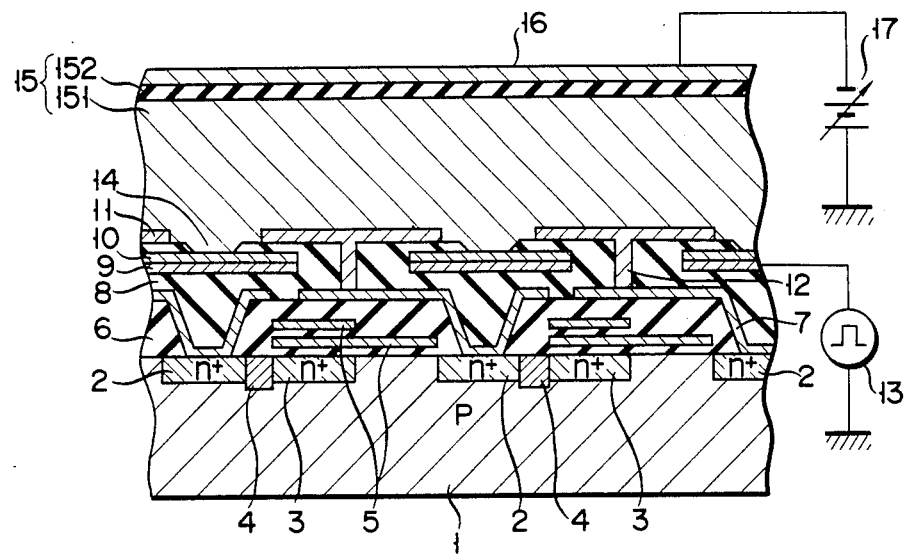
FIG. 1 is a cross-sectional view schematically showing an image sensor according to the invention.

FIG. 1 is a cross-sectional view of a solid-state image sensor according to the invention. The image sensor is manufactured by diffusing an n+type impurity in one major surface of a p-type silicon substrate 1, forming storage sections (i.e., charge storage diodes each being a p-n junction) and vertical transfer section 3 (i.e., vertical CCD registers for n+type buried channel CCDs). Each storage section 2 is positioned close to one vertical transfer section 3. Channel stopper 4 is formed between adjacent sections 2 and 3, separating these sections from each other. Insulating layer 6 is formed on substrate 1, except for the n+type regions of storage sections 2. Two transfer electrodes are formed within insulative layer 6 above each vertical transfer section 3, and are insulated from each other. When an external pulse is supplied to each pair of transfer electrodes 5, charges are transferred from storage section 2 to transfer section 3 located below electrodes 5. Sections 3 sequentially transfer the charges toward a horizontal transfer section (not shown) in one direction.

First electrodes 7, each acting as a pixel and made of aluminum-silicon alloy, are formed on layer 6 and electrically connected to storage sections 2. Insulating layer 8 of polyimide is formed on electrodes 7, providing the device with a flat surface.

Figure 2:
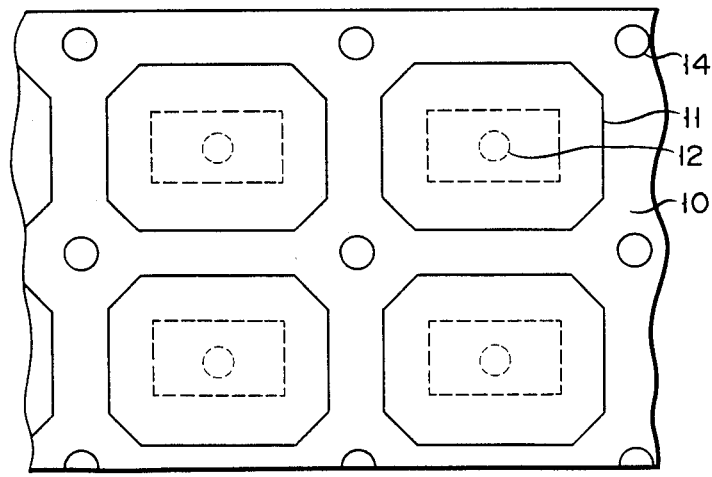
FIG. 2 is a plan view schematically illustrating the image sensor.

A chromium film is formed on layer 8 by sputtering to a thickness of about 2000 Å, and a film of p-type hydrogenated amorphous silicon (hereinafter called a-Si:H film) is formed to a thickness of 200 Å by glow-discharge decomposition, whereby a two-layer structure is formed. The two-layer structure is then subjected to selective etching, thus forming fourth electrode 9 and semiconductor film 10. As shown in FIG. 2, the two-layer structure has rectangular openings which expose those portions of layer 8 where contact holes 12 will be made. Fourth electrode 9 is connected to a contact pad (not shown) which will be connected to external power source 13 used to supply a bias voltage. Another insulative layer 8 of polyamide is formed on the two-layer structure, thus providing the device with a flat surface. First contact holes 12 and second contact holes 14 are cut in insulative layer 8, thereby exposing portions of first electrodes 7 and the portions of semiconductor film 10.

Second electrodes 11 of aluminum-silicon alloy are formed on insulative layer 8 at regular intervals, each filling up one contact hole 12. Electrodes 11 are, therefore, electrically connected to first electrodes 7. Photoconductive layer 15 is formed on second electrodes 11 by glow-discharge decomposition. Layer 15 comprises an i-type a-Si:H layer 151 formed on electrodes 11 to a thickness of about 3 µm, and a p-type hydrogenated amorphous silicon carbide (hereinafter called a-SiC:H) film 152 formed on layer 151 to a thickness of about 200 Å. Third electrode 16 made of ITO (Indium Tin Oxide) is formed on photoconductive layer 15 by magnetron-sputtering. The p-type a-SiC:H film 152 prevents electrons from being injected from the third electrode 16 into layer 151. Third electrode 16 is connected to an external power source 17 and can be supplied with a bias voltage from power source 17.

FIG. 2 shows the positional relationship between the semiconductor film 10 and second electrodes 11. As shown in this figure, second electrodes 11 are octagonal plates. They overlap semiconductor film 10 and fourth electrode 9. In FIG. 2, circles denote contact holes 12 and 14. Contact holes 14 are located at every other two corners of each second electrode 11.

The signal charges in the embodiment described above are electrons. Second electrodes 11 are therefore used to inject electrons into an i-type a-Si:H layer 151. On the other hand, semiconductor film 10 and a p-type a-SiC:H film 152 prevent electrons from entering fourth electrode 9 and third electrode 16. Second electrodes 11, an i-type a-Si:H layer 151, semiconductor film 10 and fourth electrode 9 constitute overflowed drain diodes. On the other hand, an i-type a-Si:H layer 151 and a p-type a-SiC:H film 152 constitute photodiodes. Second electrodes 11 function commonly for both types of diodes. Hence, overflowed lane diodes are connected to photodiodes in parallel.

Figure 3A:
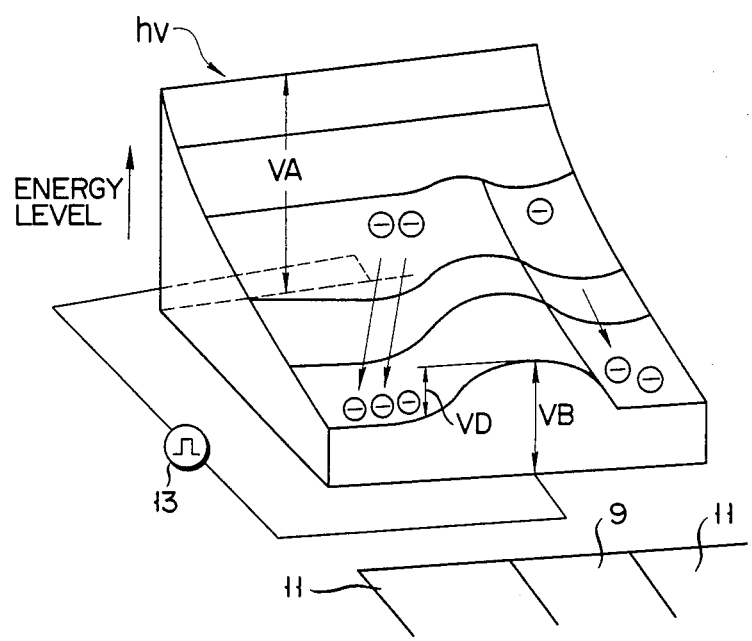
FIGS. 3A and 3B show the energy bands obtained when different amounts of light are applied to the image sensor.
Figure 3B:
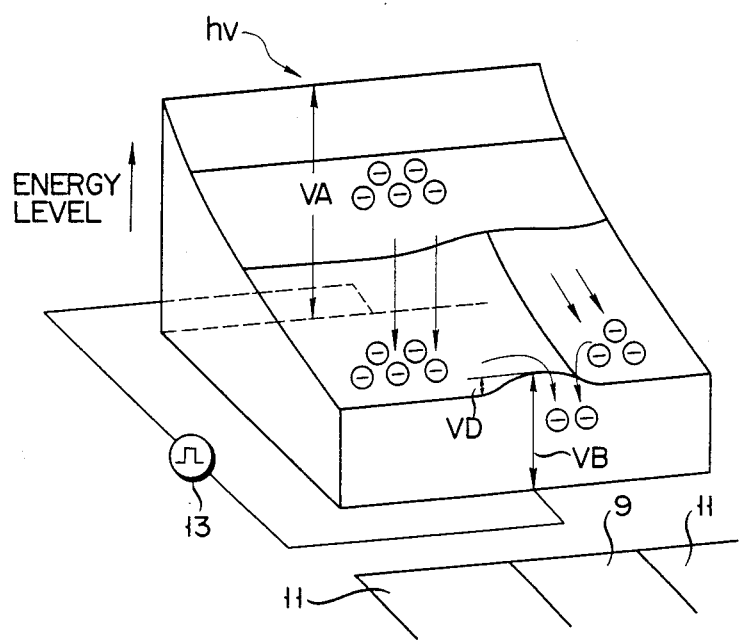

FIGS. 3A and 3B show energy bands, explaining how to restrict blooming in the above embodiment of the invention. FIG. 3A shows an energy band obtained when the amount of light applied to the image sensor is relatively small. FIG. 3B shows an energy band obtained when the amount of light applied to the image sensor is relatively large. In these figures, $V_A$ is the barrier energy generated by a p-type a-SiC:H film 152 and third electrode 16, $V_B$ is the barrier energy created by fourth electrode 9 and semiconductor film 10, $V_D$ is the difference between the energy possessed by second electrodes 11 and the energy possessed by semiconductor film 10. It is desired that the p-type layer of each photodiode be made of such material that $V_A$ is equal to or greater than $V_B$ when fourth electrode 9 is at zero potential. Hence, a p-type a-SiC:H film 152 is used as the p-type layer of the photodiodes, and semiconductor film 10 used as the common p-type layer of the overflowed drain diodes is made of p-type a-Si:H. When light is applied to the image sensor, electron-hole pairs are generated within i-type a-Si:H layer 151. The electron-hole pairs are moved, urged by the internal electric field of layer 151. Most of them do not pass semiconductor film 10 to reach fourth electrode 9; rather they are collected by second electrodes 11. As a result, the electrical charge is accumulated in the image sensor.

When the amount of the light applied to the image sensor is relatively small, as shown in FIG. 3A, the energy of second electrodes 11 increases only slightly. Energy difference $V_D$ is therefore sufficient enough that the electrons collected in second electrodes 11 cannot move into fourth electrode 9 through semiconductor film 10. All electrons therefore move into vertical transfer section 3. Conversely, when the the amount of the light applied to the image sensor is relatively large as shown in FIG. 3B, the energy of second electrodes 11 increases so much that energy difference $V_D$ decreases. The electrons in excess of the maximum transfer charge, which are collected in second electrodes 11, therefore move into fourth electrode 9 through semiconductor film 10. Hence, blooming can be controlled by adjusting $V_B$ in accordance with the bias voltage applied from external power source 13, thereby moving the excessive electrons into fourth electrode 9. The bias voltage can be replaced by a pulse voltage.

The operation of the solid-state image sensor described above will now be explained. FIGS. 4A and 4B are timing charts illustrating when pulses are supplied while signals are being supplied from storage sections 2 to vertical transfer sections 3, thereby driving the image sensor to restrict blooming, afterimage, or both. More specifically, FIG. 4A shows when a pulse voltage is applied to the vertical transfer electrodes, and FIG. 4B illustrates when a pulse voltage is applied to fourth electrode 9. In FIG. 4A, I denotes charge-transfer pulse, and II designates a data-readout pulse.

FIGS. 5A to 5D show the potentials which the charge storage section 2, vertical transfer section 3 and transfer electrode 5 possess during periods t1 to t4 (FIG. 4A).

During period t1, voltage $V_{C1}$ is applied to fourth electrode 9. When intense light is applied to the image sensor, the potential of charge storage section 2 falls, but never falls to below value $V'_{C1}$. Hence, the charge Qmax is equal to $C(V_R - V'_{C1})$, where C is the capacity of charge storage section 2, $V_R$ is the potential generated below the transfer electrodes 5 of each pair. Therefore, when voltage $V'_{C1}$ is so controlled that Qmax becomes equal to the maximum transfer capacity of vertical transfer section 2, the charge remains at Qmax as shown in FIG. 5B. This is because an excessive charge, if any, is transferred to the fourth electrode 9.

During period t2, the data-readout pulse is at a high level. Stored charge Qmax is therefore transferred from charge storage section 2 to vertical transfer section 3. As charge Qmax is transferred to section 3, the potential of section 2 gradually rises from $V'_{C1}$. As a result, charge $Q_B$ generated by the light applied to the image sensor during period t2 is accumulated in both sections 2 and 3 as shown in FIG. 5B, and the potential of charge storage section 2 lowers to $V'_{C2}$. The potential of section 2 cannot become $V'_{C1}$ or less during period t2. Vertical transfer section 3 cannot transfer charge $Q_B$, and charge $Q_B$ inevitably overflows section 3 or are left in charge storage section 2. Consequently, blooming or afterimage will likely occur. To avoid blooming or afterimage, pulse voltage $V_{C2}$ is applied to fourth electrode 9 during periods t3 and t4. Pulse voltage has such value that the potential of charge storage section 2 will eventually become equal to $V_R$. Therefore, excessive charge $Q_B$ is transferred to fourth electrode 9 having a higher potential, as shown in FIG. 5C, whereby charge storage section 2 has potential $V_R$. Charge $Q_B$ does not overflow vertical transfer section 3. Nor is it left in charge storage section 2. Hence, neither blooming nor afterimage takes place.

During period t4, the data-readout pulse is at low level. As a result, charge Qmax is transferred from charge storage section 2 to vertical transfer section 3 as shown in FIG. 5D, and second electrodes 11 start accumulating charge.

In the embodiment described above, fourth electrode 9 is embedded in insulative layer 8 and overlaps second electrodes 11, and semiconductor film 10 is embedded in layer 8, except for those portions contacting photoconductive layer 15. Due to this arrangement, fourth electrode 9 can shield light, significantly reducing smear. Further, since the energy $V_B$ (FIGS. 3A and 3B) is determined by the junction between semiconductor film 10 and i-type a-Si:H layer 151, scarcely influenced by the dimensions or material of fourth electrode 9, the voltage-breakdown at the interface between electrodes 9, on the one hand, and second electrodes 11, on the other, is effectively prevented. Still further, fourth electrode 9, which controls the excessive charge $Q_B$, can be made as large as a pixel. This helps to simplify the process of manufacturing the image sensor.

Figure 6:
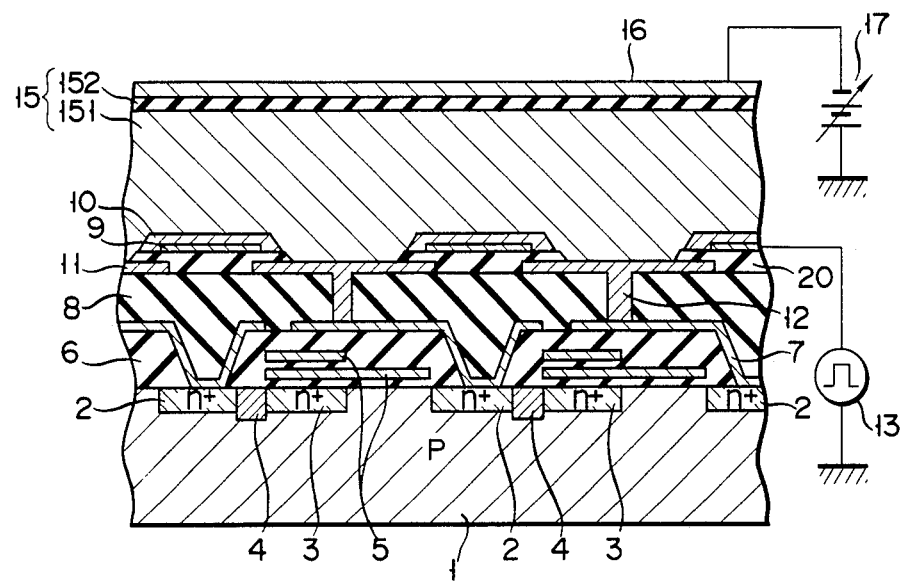
FIG. 6 is a cross-sectional view schematically showing another image sensor according to the invention.

Another embodiment of the invention will be described with reference to FIGS. 6 and 7. The same elements as those shown in FIGS. 1 and 2 are designated by the same numerals, and will not be described in detail. This embodiment is different from the first embodiment in some respects. First, insulative layers 20 of polyamide are formed in the gaps between second electrodes 11. Secondly, fourth electrodes 9 made of chromium are formed on insulative layers 20. Thirdly, semiconductor film 10 of a p-type a-Si:H is formed on the fourth electrodes 9, so that they will not be short-circuited with the second electrodes 11. Fourth electrodes 9 overlap second electrodes 11.

Figure 7:
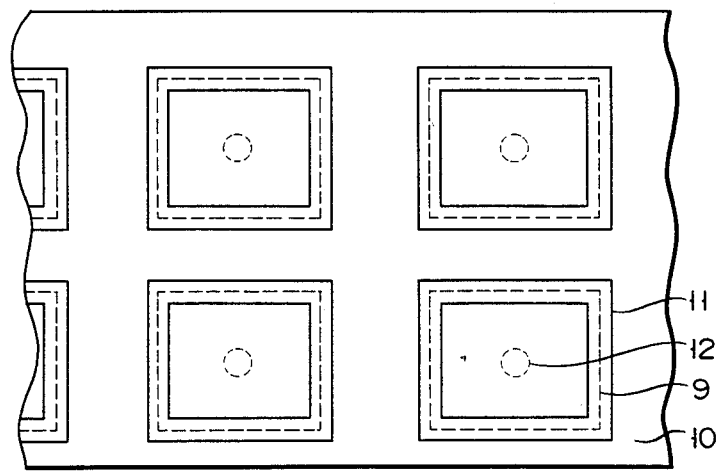
FIG. 7 is a plan view schematically illustrating the image sensor shown in FIG. 6.

FIG. 7 shows the positional relationship between fourth electrodes 9, semiconductor film 10 and second electrodes 11. As shown in this figure, second electrodes 11 are rectangular. Not only does the embodiment of FIGS. 6 and 7 have the same advantages as the first embodiment, but also is it advantageous in that, since overflowed drain diodes are uniformly distributed around each second electrode 11, the energy is uniformly distributed, promoting an easy transfer of excessive electrodes.

In both embodiments described above, the overflowed drain diodes are made of i-p junctions, and the signal charges are electrons. Nonetheless, the invention is not limited to this. The overflowed drain diodes can be made of n-i-p junctions. Further, the signal charges can be holes. When such is the case, the conductivity type of each conductive layer or semiconductor layer must be reversed. Still further, semiconductor film 10 can be made of a hydrogenated amorphous silicon nitride or a polycrystalline silicon, instead of an a-Si:H.

As described above, the solid-state image sensor of this invention has an overflowed drain structure, which is located in the gaps between the pixel electrodes and is made of the fourth electrode overlapping the pixel electrodes and the semiconductor film preventing the injection of electrons or holes into the photoconductive film and fourth electrode. Owing to the overflowed drain structure, the image sensor can reliably operate, causing neither blooming nor smear.

What is claimed is:

1. A solid-state image sensor comprising:
    a photoconductive film for converting incident light rays to electrical charges;
    a semiconductor substrate having storage sections corresponding to pixels for storing charges and a transfer section for transferring the charges from the storage sections in the form of output image signals;
    first electrodes each having one end connected to the corresponding storage section and insulated from the transfer section, said first electrodes being arranged at predetermined intervals and extending above a semi-conductor substrate;
    an insulating film formed on the first electrodes and having a flat surface;
    second electrodes formed on the flat surface of the insulating film, arranged at predetermined intervals forming gaps therebetween and electrically connected to the first electrodes, said photoconductive film being formed on these second electrodes;
    a barrier layer formed on the photoconductive film, forming a barrier protecting the photoconductive film;
    a transparent third electrode formed on the barrier layer;
    fourth electrodes formed on the insulating film, electrically connected to ne another and electrically insulated from the second electrodes, each of said fourth electrodes having a peripheral region facing the adjacent second electrodes said fourth electrodes overlapping said gaps between said second electrodes; and
    a semiconductor layer formed on the fourth electrodes for preventing one of electrons and holes from passing through the semiconductor layer from the fourth electrodes to the photoconductive film, allowing the one to pass through the semiconductor layer form the photoconductive film to the fourth electrode, said semiconductor layer said photoconductive film and said electrodes forming a diode structure.

2. A solid-state image sensor according to claim 1, wherein said photoconductive film and said semiconductor layer are made of the same semiconductor material.

3. A solid-state image sensor according to claim 1, wherein said photoconductive film is i-type and said semiconductor layer is either p-type or n-type.

4. A solid-state image sensor according to claim 1, wherein said fourth electrodes and said semiconductor layer are partly embedded in said insulating film, and said semiconductor layer has a portion directly connected to said photoconductive film.

5. A solid-state image sensor according to claim 1, further comprising:
    insulative layers formed on said insulating film wherein each of said second electrodes has a peripheral region embedded in said insulative layers, and said fourth electrode and said semiconductor layers are formed on said insulative layers.

6. A solid-state image sensor according to claim 1, further comprising a voltage source for applying a drive voltage to said fourth electrodes.

7. A solid-state image sensor according to claim 1, wherein said semiconductor layer and said photoconductive film are made of hydrogenated amorphous silicon.

* * * * *